US006831657B2

(12) United States Patent
Tsutsumi et al.

(10) Patent No.: US 6,831,657 B2
(45) Date of Patent: Dec. 14, 2004

(54) DISPLAY CONTROL APPARATUS FOR DISPLAYING GAIN SETTING VALUE IN PREDETERMINED COLOR HUE

(75) Inventors: Kazumasu Tsutsumi, Hamamatsu (JP); Hajime Asahira, Hamamatsu (JP); Tomoaki Makino, Hamamatsu (JP); Hiroyuki Fujita, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 79 days.

(21) Appl. No.: 10/225,386

(22) Filed: Aug. 21, 2002

(65) Prior Publication Data

US 2003/0039372 A1 Feb. 27, 2003

(30) Foreign Application Priority Data

Aug. 27, 2001 (JP) ....................................... 2001-255965

(51) Int. Cl.[7] ............................ G09G 5/02; G09G 5/00; H03G 3/00

(52) U.S. Cl. ....................... 345/589; 345/690; 345/619; 345/22; 381/104

(58) Field of Search ................................ 345/589, 593, 345/597, 617, 619, 690, 581, 22, 601, 11–13, 24; 381/58, 109, 107, 106, 104, 56; 348/353, 731, 365, 569–570

(56) References Cited

U.S. PATENT DOCUMENTS 5,477,262 A * 12/1995 Banker et al. ................ 725/38
5,764,179 A * 6/1998 Tsurumoto .................. 341/176
5,771,041 A * 6/1998 Small ......................... 345/727
5,940,517 A * 8/1999 Shinada et al. ............... 381/58
6,009,181 A * 12/1999 Kim ........................... 381/109

OTHER PUBLICATIONS

Japanese Utility Model Application Laid–open Publication No. 57–70110.
Japanese Utility Model Application Laid–open Publication No. 57–67419.
Japanese Utility Model Application Laid–open Publication No. 7–12978.

* cited by examiner

*Primary Examiner*—Matthew C. Bella
*Assistant Examiner*—Wesner Sajous
(74) *Attorney, Agent, or Firm*—Pillsbury Winthrop LLP

(57) ABSTRACT

Musical sound signal is input to an electronic volume control unit, which in turn adjusts the gain of the input musical signal and outputs the resultant gain-adjusted signal to an amplifier. CPU supplies the electronic volume control unit with a sound volume setting level corresponding to an output of a rotary encoder. At the same time, the CPU generates, with reference to stored data of a ROM table, a hue control signal for changing a displaying hue of a three-color light-emitting diode in accordance with the sound volume setting level supplied by the CPU. The CPU takes in a current sound volume setting level when an upper-limit setting switch is activated, and it retains the taken-in level as an upper limit value of various sound volume setting levels that are to be used to change the displaying hue of the light-emitting diode between purple and red hues. As the sound volume setting level is changed from zero to the upper limit value, the displaying hue changes in a stepwise manner.

15 Claims, 8 Drawing Sheets

COLOR TABLE NO.

| $y_L$ | $y_C$ | $y_R$ |
|---|---|---|
| 10 | 12 | 12 |
| 9 | 11 | 12 |
| 8 | 10 | 12 |
| 7 | 9 | 11 |
| 6 | 8 | 10 |
| 5 | 7 | 9 |
| 4 | 6 | 8 |
| 3 | 5 | 7 |
| 2 | 4 | 6 |
| 1 | 3 | 5 |
| 0 | 2 | 4 |
| 0 | 1 | 3 |
| 0 | 0 | 2 |

COLOR TABLE NO.

| $y_L$ | $y_C$ | $y_R$ |
|---|---|---|
| 11 | 12 | 12 |
| 10 | 11 | 12 |
| 9 | 10 | 11 |
| 8 | 9 | 10 |
| 7 | 8 | 9 |
| 6 | 7 | 8 |
| 5 | 6 | 7 |
| 4 | 5 | 6 |
| 3 | 4 | 5 |
| 2 | 3 | 4 |
| 1 | 2 | 3 |
| 0 | 1 | 2 |
| 0 | 0 | 1 |

DISPLAY CONTROL APPARATUS FOR DISPLAYING GAIN SETTING VALUE IN PREDETERMINED COLOR HUE

BACKGROUND OF THE INVENTION

The present invention relates to an improved display control apparatus for use with an audio amplifier or other type of amplifier to visually display a gain setting value, such as a sound volume setting level, in one of predetermined color hues.

In recent years, more and more sound amplifiers, such as audio amplifiers, adjust a sound volume setting level through voltage control using an electronic volume control unit. Having no mechanical sliding element, the electronic volume control unit does not substantially deteriorate in performance due to aging and wear and is easy to control remotely.

For example, the electronic volume control unit employs, as a setting operator, a rotary encoder outputting a rotating amount and rotating direction. Thus, a current sound volume setting level can be known from a rotating angle alone. Similarly, in a case where up and down buttons are employed as setting operators, the current sound volume setting level can not be known from the number of button depressions alone. Therefore, it has heretofore been impossible to know or ascertain the current sound volume setting level, except by viewing a display showing a numeral value indicative of the current sound volume setting level or actually listening to a sound generated in accordance with the current sound volume setting level.

For example, the electronic volume control unit retains a sound volume setting level when the power to the audio amplifier was turned off last, so as to retrieve the thus-retained sound volume setting level once the power to the audio amplifier is turned on afterwards. However, while some users may turn off the power after reducing the sound volume setting level to a minimum, other users turn off the power leaving the sound volume setting level as has been used so far to produce a sound with a relatively great volume; such a difference between the users perhaps depends on users' habits. Therefore, unless the current sound volume setting level is known prior to audible reproduction of tone signals following turning-on of the power, the reproduction of the tone signals is likely to start with an undesirable great volume.

In some cases, an attenuation amount is displayed in a numerical value via LEDs (light emitting diodes), fluorescent display tube, LCD (Liquid Crystal Display) or the like, to show the current sound volume setting level. In such cases, the displayed attenuation amount tends to be difficult to recognize if the display is a little away from the user, due to a small displaying area of the display.

The mechanical volume control unit, in contrast, can indicate the current sound volume setting level by a rotating angle of a small marker provided on a volume setting knob; however, the small marker is difficult to recognize at a distance, and a numerical value indication on the operation panel is also difficult to accurately read.

SUMMARY OF THE INVENTION

In view of the foregoing, it is an object of the present invention to provide an improved display control apparatus for displaying a gain setting value in a predetermined hue which allows a user to accurately identify, at a glance, a gain setting value, such as a sound volume setting level, by a displaying hue of a hue-variable display device and which allows the user to set a desired range of gain setting values for changing the displaying hue of the hue-variable display device.

To accomplish the above-mentioned object, the present invention provides an improved display control apparatus for displaying a gain setting value in a color hue, which comprises: an input-upper-limit setting section that sets a predetermined upper limit value of gain setting values to be input to the display control apparatus; and a displaying-hue control section that receives a gain setting value from a variable gain control device. When the received gain setting value is not greater than the predetermined upper limit value, the displaying-hue control section outputs a hue control signal to vary a displaying hue of a hue-variable display device between a predetermined first hue and a predetermined second hue in accordance with magnitude or intensity of the received gain setting value. But, when the received gain setting value is greater than the predetermined upper limit value, the displaying-hue control section outputs a hue control signal to set the displaying hue of the hue-variable display device to the predetermined second hue.

With such arrangements of the present invention, the user can set a desired upper limit of the input gain-setting values that are to be used to change the displaying hue of the hue-variable display device between the predetermined first hue and the predetermined second hue.

In actual use, the variable-gain control device is often operated within a range of gain setting values smaller than its predetermined maximum gain setting value; such gain setting values smaller than the predetermined maximum gain setting value will hereinafter be referred to as "normally-used gain setting values". Even in such cases, by using the input-upper-limit setting section to set, as the above-mentioned predetermined upper limit value, an upper limit of the normally-used gain setting values (hereinafter called a "practical upper limit"), the user is allowed to readily know, at a glance, a varying range of the current gain setting value up to the thus-set practical upper limit by just viewing the displaying hue of the hue-variable display device changing between the first and second hues.

Further, as the current gain setting value is increased, the user can readily recognize arrival at the practical upper limit by the displaying hue of the hue-variable display device changing to the predetermined second hue.

For example, the above-mentioned input-upper-limit setting section may be arranged to, upon detecting activation of an input-upper-limit setting operator, take in a current gain setting value of the variable-gain control device and retain the taken-in value as the predetermined upper limit. This way, the input-upper-limit setting section can be implemented in a simple manner.

According to another aspect of the present invention, there is provided a display control apparatus for displaying a gain setting value in a color hue, which comprises: an input-range setting section that sets a predetermined lower limit value and predetermined upper limit value of gain setting values that are input to the display control apparatus; and a displaying-hue control section that receives a gain setting value from a variable gain control device. When the received gain setting value is equivalent to or greater than the predetermined lower limit value but equivalent to or smaller than the predetermined upper limit value, the displaying-hue control section outputs a hue control signal to vary a displaying hue of a hue-variable display device between a predetermined first hue and a predetermined second hue in accordance with intensity of the received gain setting value. Further, when the received gain setting value is smaller than the predetermined lower limit value, the displaying-hue control section outputs a hue control signal to set the displaying hue of the hue-variable display device to the predetermined first hue. Furthermore, when the received gain setting value is greater than the predetermined upper limit value, the displaying-hue control section outputs a hue control signal to set the displaying hue of the hue-variable display device to the predetermined second hue.

With such arrangements of the present invention, the user can set desired upper and lower limits of the input gain setting values that are to be used to change the displaying hue of the hue-variable display device between the predetermined first hue and the predetermined second hue.

By using the input-upper-limit setting section to set, as the above-mentioned predetermined upper and lower limits, practical upper and lower limits of normally-used gain setting values, the user is allowed to readily know a varying range of the current gain setting value from the thus-set practical lower limit to the set practical upper limit by just taking a glance at the displaying hue of the hue-variable display device changing between the first and second hues.

Further, as the current gain setting value is decreased, the user can recognize arrival at the practical lower limit by the displaying hue of the hue-variable display device changing to the predetermined first hue. Similarly, as the current gain setting value is increased, the user can recognize arrival at the practical upper limit by the displaying hue of the hue-variable display device changing to the predetermined second hue.

For example, the above-mentioned input-range setting section may be arranged in such a manner that, upon detecting activation of an input-lower-limit setting operator, it takes in a current gain setting value of the variable-gain control device and retain the taken-in value as the predetermined lower limit, and that, upon detecting activation of an input-upper-limit setting operator, it takes in a current gain setting value of the variable-gain control device and retain the taken-in value as the predetermined upper limit. This way, the input-range setting section can be implemented in a simple manner.

In one embodiment of the present invention, the predetermined first hue is "purple" or "blue" and the predetermined second hue is "red". Because such first and second hues can provide displaying hue variations agreeing with human feelings about safety and danger (as in the case of traffic lights), the user can intuitively recognize the current gain setting value. In particular, if the predetermined first hue is set to "purple", it is possible to make the best of the hue displaying capability of the hue-variable display device.

The following will describe embodiments of the present invention, but it should be appreciated that the present invention is not limited to the described embodiments and various modifications of the invention are possible without departing from the basic principles of the invention. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE INVENTION

Figure 1:
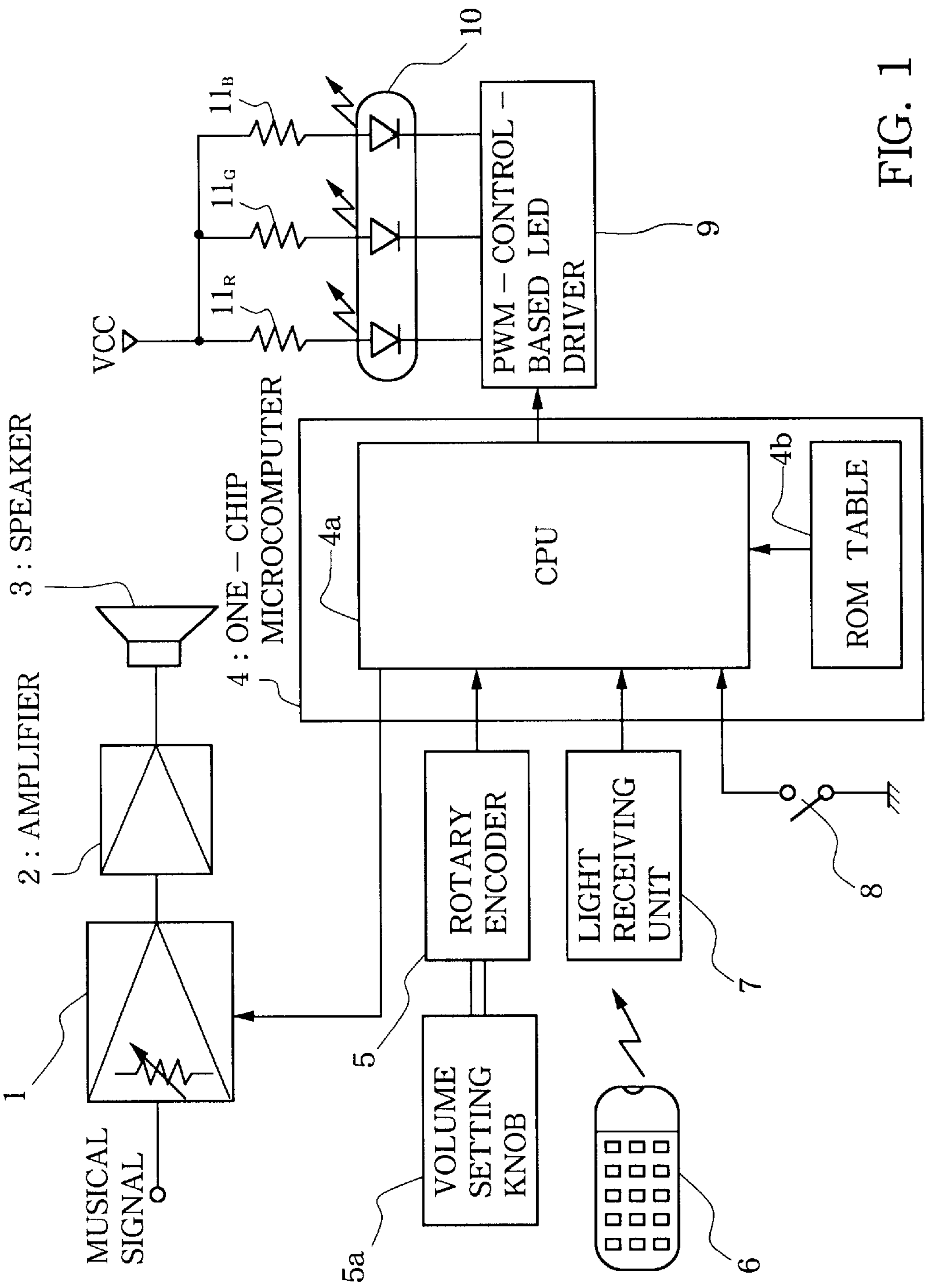
FIG. 1 is a block diagram showing a general setup of a display control apparatus of the present invention which is applied to an audio amplifier employing an electronic volume control unit.

FIG. 1 is a block diagram showing a general setup of a display control apparatus in accordance with an embodiment of the present invention, which is arranged to visually display a gain setting value in a predetermined one of a plurality of color hues. The embodiment of FIG. 1 will hereinafter be described as applied to an audio amplifier employing an electronic volume control unit.

In FIG. 1, reference numeral 1 represents the electronic volume control unit 1 that receives a sound signal, such as a musical signal, variably adjusts a sound volume setting level (in other words, an attenuation amount) of the received sound signal and then outputs the thus-adjusted sound signal to an amplifier section 2. The amplifier section 2 amplifies the output signal of the electronic volume control unit 1 so that the amplified signal is audibly reproduced or sounded via a speaker 3. Generally speaking, the attenuation amount adjustment is equivalent to gain adjustment, which, in the illustrated example, adjusts the overall gain of the audio amplifier including the amplifier section 2.

Reference numeral 4 represents a one-chip microcomputer 4; only a CPU (Central Processing Unit) 4_a_ and ROM (Read-Only memory) table 4_b_ of the microcomputer 4 are shown in the figure for the sake of clarity.

Further, reference numeral 5 represents a rotary encoder, which is turned in either of two directions via a volume setting knob 5_a_ and outputs, to the CPU 4_a_, a signal indicative of its direction and amount of the rotation. The CPU 4_a_ retains a current value of the sound volume setting level and updates the current value by increasing or decreasing the current value in accordance with the amount of the rotation. Direction of the current value updating (increase or decrease) depends on the direction of the rotation of the rotary encoder 5.

Reference numeral 6 represents a remote controller, and 7 a light-receiving unit. The remote controller 6 generates a control signal in response to depression, by the user, of any of a plurality of buttons provided thereon and transmits the thus-generated control signal to the light-receiving unit 7 by infrared ray. In turn, the light-receiving unit 7 passes the control signal to the CPU 4a. The function of the above-mentioned rotary encoder 5 can also be performed via the remote controller 6 by the user depressing any of the buttons. Also note that the remote controller 6 can also perform a function of an upper limit setting switch 8 to be later described. Reference numeral 9 represents a PWM (pulse Width Modulation)-controlled LED driver circuit.

Further, reference numeral 10 represents a light-emitting diode unit including LED chips of three different colors, "red", "green"; and "blue", that are enclosed together in a single package, and these three LED chips are connected with load-current limiting resistors $\mathbf{11}_R$, $\mathbf{11}_G$ and $\mathbf{11}_B$, respectively.

The CPU 4a retains and supplies the sound volume setting level to the electronic volume control unit 1 in accordance with the output of the rotary encoder 5. Simultaneously, the CPU 4a generates, in accordance with the output of the rotary encoder 5, a hue control signal to change the overall displaying hue of the three-color light-emitting diode unit 10 with reference to the ROM table 4b, and it outputs the thus-generated hue control signal to the PWM-control-based LED driver circuit 9.

The PWM-control-based LED driver circuit 9 processes, as a PWM control signal, each of driving currents to be applied to the red-, green- and blue-color LED chips; it controls a ratio of an ON time to a corresponding one cyclic period of the PWM control signal in accordance with the above-mentioned hue control signal, so as to control a ratio in brightness or intensity level among the LED chips with a view to controlling the overall displaying hue of the diode unit 10 comprised of mixed color outputs from the individual LED chips.

In this way, the CPU 4a not only controls the sound volume setting level of the electronic volume control unit 1, but also controls the displaying hue of the light-emitting diode unit 10.

In a case where the displaying hue of the light-emitting diode unit 10 is set to change between a predetermined first hue and a predetermined second hue (i.e., where the hue varying range is set between the first and second hues), the first and second hues may be chosen as desired by the user. However, to facilitate "intuitive" recognition of the current sound volume setting level based on human sense or perception, it is preferable to set the first hue at "purple" or "blue" for relatively low (small) sound volume setting levels, and set the second hue at "red" for relatively high (great) sound volume setting levels because the high sound volume setting levels are likely to lead to undesirably large sounds and hence require considerable precaution. Further, it is preferable that medium sound volume setting levels be set to a "green" hue and sound volume setting levels requiring a little precaution be set to a "yellow" hue. Because the thus-chosen color hues match with human feelings about safety and danger (as in the case of traffic lights), they allow the user to intuitively identify the current sound volume setting level through the hue display by the light-emitting diode unit 10.

Now, a description will be made about the display control of the invention in relation to the case where the first hue is set at "purple" while the second hue is set at "red". The scheme of displaying the sound volume level in a predetermined color hue would present some problems in actual use or operation.

Now, consider a given electronic volume control unit which is arranged to change attenuation amounts of 0 dB to −79 dB and −∞dB (mute) in 66 steps. Whereas the volume setting level is varied by more than a few decibels per step in a "great attenuation" region, it is varied by one decibel per step in most of the remaining attenuation regions. Let it be also assumed here that color hues ranging from "purple" to "red" are assigned, in a proportional manner, to respective ones of the 66 steps starting with the −∞dB step. If the electronic volume control unit is used or operated up to the 0 dB attenuation position (i.e., up to a maximum value of gain affordable by the audio amplifier), the displaying hue can turn "red", from which the user can know that the current sound volume setting level is at a "dangerous" value. However, in actual cases, the electronic volume control unit is seldom operated up to the 0 dB attenuation position, and therefore the user can not accurately know from the displaying hue that the current sound volume setting level is at an upper limit value that may lead to a "dangerous" result in actual use.

As another problem, it would not be possible to make the best of the hue displaying capability. Namely, an actual operating (use) range of the audio amplifier is generally from about −32 dB to about −18 dB, and the audio amplifier is set to the −∞dB position to minimize the sound volume.

In the illustrated example of FIG. 1, the actual operating (use) range of the electronic volume control unit 1 is about 50–70% of all the steps starting with the −∞dB step. Thus, assuming that a total of 13 color table numbers y (i.e., color table numbers 0–12) as will be later described with reference to FIG. 2, the actual operating (use) range of the electronic volume control unit is from a "green" color position to an "orange" color position, and the electronic volume control unit is operated up to the "blue" or "purple" color position only when the sound volume is to be turned down to a mute or near-mute level. In contrast, the actual operating (use) range of the analog (mechanical) volume control unit is 20–40% of a maximum rotating angle if it uses resistance value variations of "A" curve characteristics. Therefore, if the hues from "purple" to "red" are assigned to respective rotating angles within an angular range determined by the maximum rotating angle, only hues in the neighborhood of "blue" are normally used in actual use.

Thus, an upper limit value of the input sound volume setting levels is set such that the user can know, by the three-color light-emitting diode unit 10 turning to the predetermined second hue, that the current sound volume setting level has reached the upper limit value of the normally-used sound volume setting levels (i.e., "practical upper limit").

Namely, for that purpose, the user turns the volume setting knob 5a to set the current sound volume setting level to the practical upper limit value, upon which the user activates the upper limit setting switch 8. At that time, the CPU 4a takes in the current value of the sound volume setting level when the upper limit setting switch 8 has been activated by the user as noted above and retains the taken-in current value as the upper limit value of the input sound volume setting levels that are to be used to change the displaying hue of the light-emitting diode unit 10 between "purple" and "red".

Figure 2:
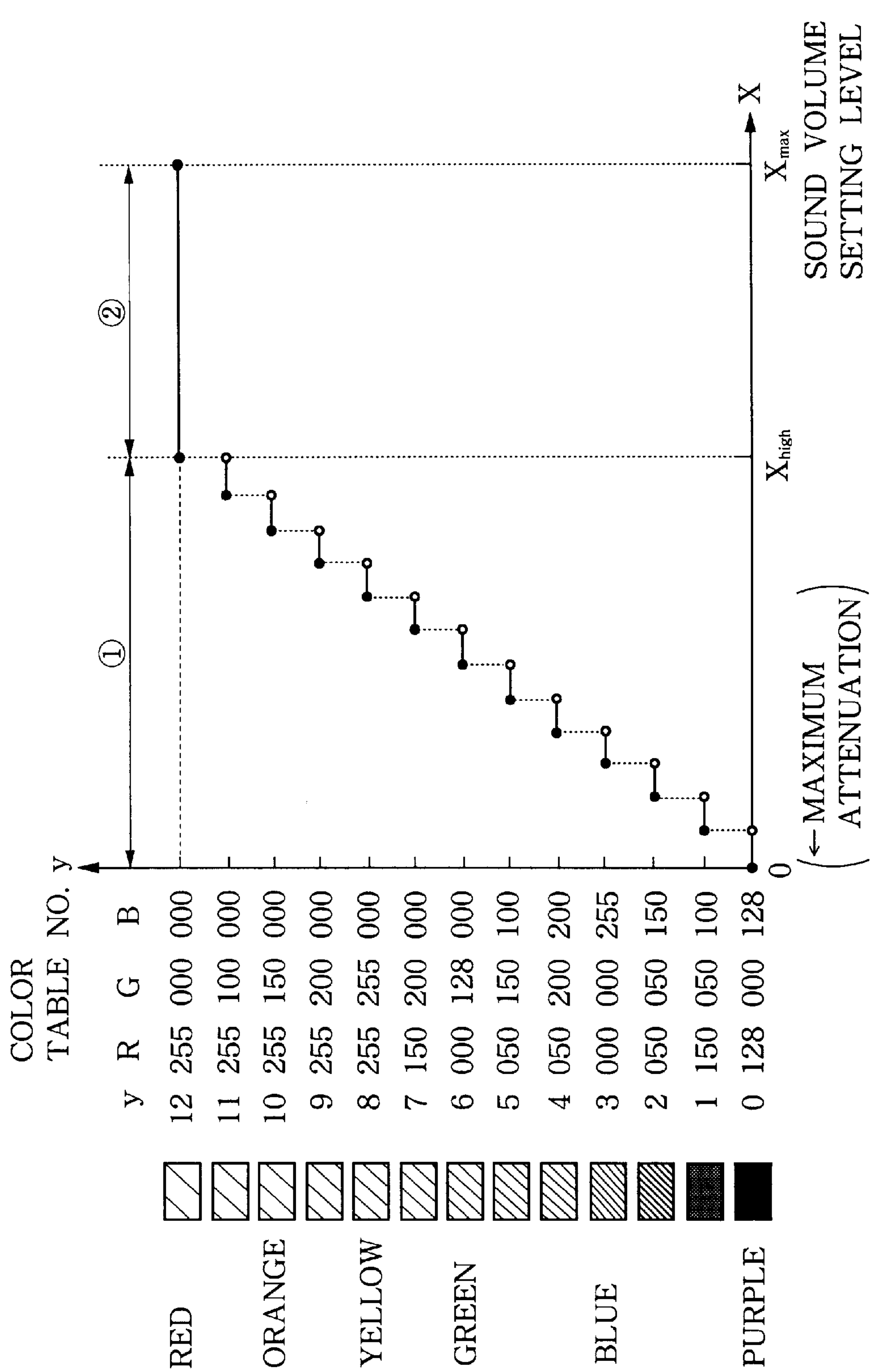
FIG. 2 is a diagram explanatory of a first example of relationship between sound volume setting levels and displaying hues of a three-color light-emitting diode unit.

FIG. 2 is a diagram explanatory of a first example of relationship between the input sound volume setting level and the displaying hue of the three-color light-emitting diode unit 10.

In FIG. 2, the horizontal axis represents the input sound volume setting level x; the minimum value of the sound volume setting level is set to "0" while the maximum value of the sound volume setting level is set to "$X_{max}$", and the practical upper limit value of the input sound volume setting levels to be used to change the displaying hue is set to "$X_{high}$". Also, in the illustrated example of FIG. 2, the sound volume setting levels are expressed as gain values in a linear scale.

Alternatively, the gain values (attenuation amounts) may be expressed in decibels in a logarithmic scale. In such a case, the minimum value "0" of the sound volume setting levels corresponds to the "−∞dB" position of the electronic volume control unit 1, and the attenuation amount immediately following the "−∞dB" position is "−79 dB".

Further, in FIG. 2, the vertical axis represents the displaying hue of the three-color light-emitting diode unit 10 in the color table number y ($0 \leqq y \leqq n$); in the illustrated example, "n" is 12.

Also, in the illustrated example of FIG. 2, where the various displaying hues are implemented by monochromatic light, the displaying hue "red" is selected when the color table number y is "12" (y=12) and the displaying hue is varied progressively to a short wavelength region in accordance with the wavelength of the monochromatic light so that the displaying hue "purple" is selected when the color table number y is "0" (y=0). Further, in FIG. 2, the various displaying hues are expressed as "pseudo" hues using various hatching patterns, for convenience of illustration.

Further, in FIG. 2, numerical values representative of various output values of the displaying hues of red (R), green (G) and blue (B) are shown in corresponding relation to the various color table numbers y. These values are stored in the ROM table 4*b* shown in FIG. 1, and they are read out in accordance with the practical upper limit value $X_{high}$ of the input sound-volume setting levels to be used to change the displaying hue and output to the PWM-control-based LED driver circuit 9.

Note that the output values of the red (R), green (G) and blue (B) hues stored in the ROM table 4*b* may be differentiated between the case where the sound volume setting levels are expressed in the linear scale and the case where the sound volume setting levels are expressed in the logarithmic scale.

Further, in the illustrated example of FIG. 2, as the sound volume setting level is increased progressively from "0", the color table number y varies stepwise from "0" representing the "purple" hue and finally reaches "12" representing the "red" hue.

Note that solid (filled-in-black) small circles in FIG. 2 each indicate that the value of the sound volume setting level x represented thereby is included while open small circles in FIG. 2 each indicate that the value of the sound volume setting level x represented thereby is excluded. In sound-volume-setting level range ②, from the upper limit value $X_{high}$ to the maximum value $X_{max}$, of the input sound volume setting level x, the color table number y is held at "12" representing the "red" hue so that the displaying hue is kept unchanged from "red".

For such purposes, the user presets the upper limit value $X_{high}$ of the sound volume setting level using the upper limit setting switch 8. The displaying hue changes from "purple" as the user increases the sound volume setting level, and once the sound volume setting level reaches the upper limit value $X_{high}$ of the normally-used sound volume setting levels, the displaying hue turns "red". Thus, by the displaying hue of the light-emitting diode unit 10 changing between the first hue of "purple" and the second hue of "red", the user can know when the sound volume setting level is in the range below the upper limit value $X_{high}$. Also, the user can know when the sound volume setting level has reached the upper limit value $X_{high}$, by the displaying hue turning "red".

The above-mentioned relationship between the sound volume setting level x and the color table number y can be expressed by the following mathematical expressions. These mathematical expressions may be used when the CPU 4*a* performs predetermined arithmetic operations by executing a predetermined program.

$$y = \text{floor}\ \{(n/X_{high}) \cdot x\}\ (0 \leqq x \leqq X_{high})$$

$$y = n\ (X_{high} \leqq x \leqq X_{max})$$

Here, "floor" is a function indicating that a decimal fraction of a numerical value in the braces "{ }" is discarded.

As another example, the respective output values of the red, green and blue hues may be controlled directly in accordance with the upper limit value $X_{high}$. However, by determining the color table number y in accordance with the input sound volume setting level x as set forth above, the relationship between the sound volume setting level x and the displaying hue can be varied in accordance with the upper limit value $X_{high}$ without having to change the output values of the red, green and blue hues.

In the illustrated example where the displaying hue is varied stepwise, rather than continuously, the steps up to the upper limit value $X_{high}$ of the hue-varying sound volume setting levels may be defined in any suitable manner other than that described above in relation to FIG. 2.

Further, in the illustrated example of FIG. 2, sound-volume setting level range ①, lower in level than the above-mentioned sound-volume setting level range ②, is divided into n (=12) equal segments; the color table number y is set to "0" (y=0) in the first segment and "11" (y=11) in the twelfth segment, and it changes to "12" when the upper limit value $X_{high}$ is reached.

In an alternative, sound-volume setting level range ① may be divided into "n+1" (=13) segments with the first and thirteenth segments each having one half of the sound volume setting width of any one of the other segments; in this case, the color table number y is set to "0" (y=0) in the first segment and "12" (y=12) in the thirteenth segment. In another alternative, sound-volume setting level range ① may be divided into "n+1" (=13) equal segments with the color table number y being set to "0" (y=0) in the first segment and "12" (y=12) in the thirteenth segment.

Whereas the embodiment of FIG. 1 has been described as allowing the user to set only a desired upper limit value $X_{high}$ of the input sound volume setting levels to be used to change the displaying hue of the three-color light-emitting diode unit 10, the display control apparatus of the present invention may be arranged to allow the user to set a desired lower limit value $X_{low}$ of the sound volume setting levels as well as the upper limit value $X_{high}$.

Figure 3:
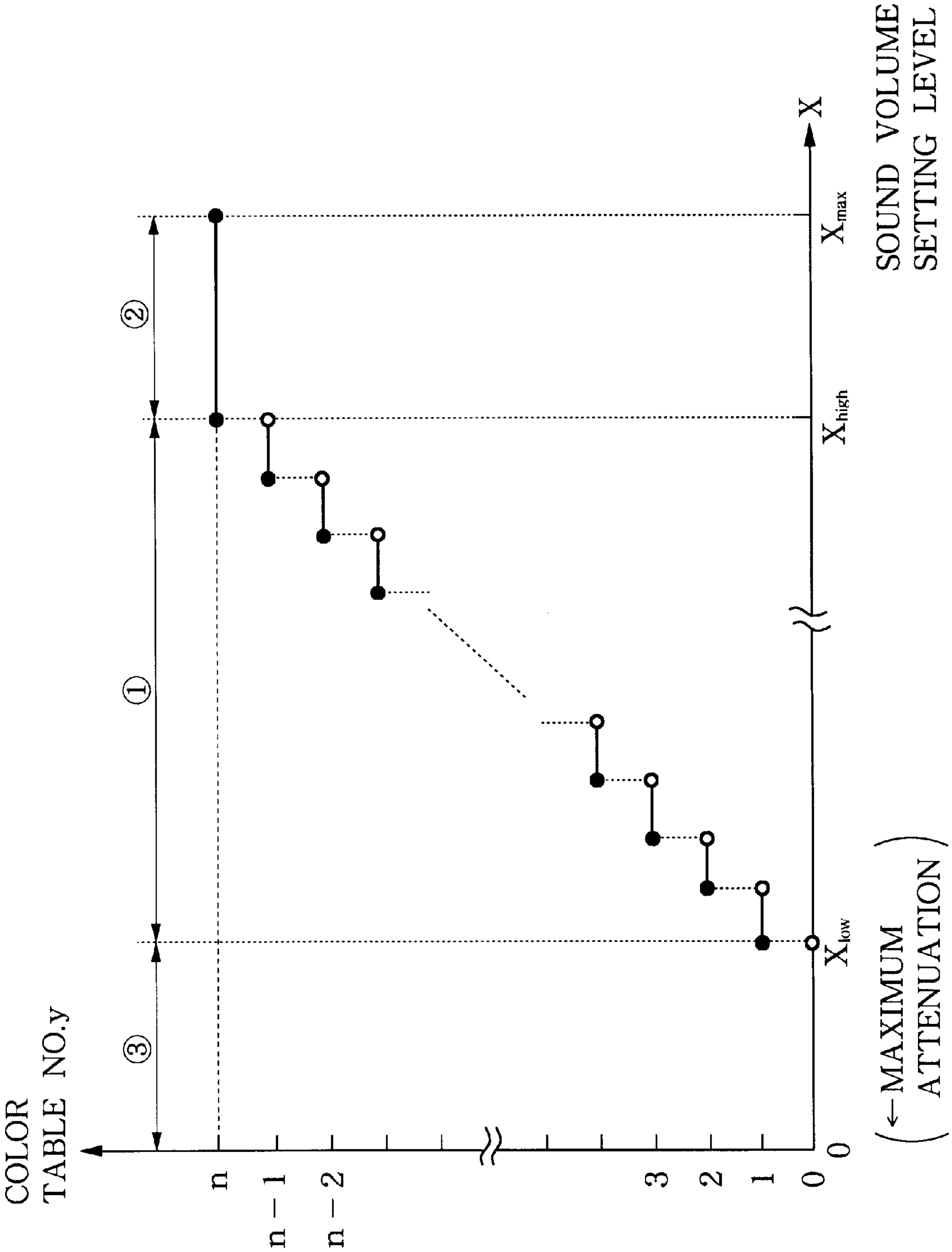
FIG. 3 is a diagram explanatory of a second example of the relationship between sound volume setting levels and displaying hues of the three-color light-emitting diode unit.

FIG. 3 is a diagram explanatory of a second example of the relationship between the sound volume setting level and the displaying hue of the three-color light-emitting diode unit 10.

In the example of FIG. 3, the horizontal axis represents the input sound volume setting level x as in the example of FIG. 2, the minimum value of the sound volume setting level is set to "0" while the maximum value of the sound volume setting level is set to "$X_{max}$", and the upper limit value of the input sound volume setting levels to be used to change the displaying hue is set to "$X_{high}$". Note that, in this example, a lower limit value "$X_{low}$" is also set on the input sound volume setting levels to be used to change the displaying hue.

Further, in FIG. 3, the vertical axis represents the displaying hue of the three-color light-emitting diode unit 10 in a color table number y ($0 \leqq y \leqq n$), as in FIG. 2. Although output values of the red (R), green (G) and blue (B) hues corresponding to various color table numbers y are not specifically shown in FIG. 3, they may be determined as appropriate in accordance with a total number of desired displaying hues of the three-color light-emitting diode unit 10; if n=12, the same output values of the red (R), green (G) and blue (B) hues shown in FIG. 2 may be applied to the example of FIG. 3.

In lower sound-volume setting level range ③ of FIG. 3, lower in level than sound-volume setting level range ①, the color table number y is held at a value "0" representing the "purple" hue so that the displaying hue of the three-color light-emitting diode unit 10 is kept "purple" throughout this range ①.

Then, as the sound volume setting level x is increased to the lower limit value $X_{low}$ and varied across the intermediate sound-volume setting level range denoted by ① in FIG. 3, the color table number y changes stepwise from "0" representing the "purple" hue until it reaches "n" representing the "red" hue. In upper sound-volume setting level range, denoted by ② in FIG. 3, from the upper limit value "$X_{high}$" to the maximum value "$X_{max}$" of the sound volume setting levels, the color table number y is held at a value "12" representing the "red" hue so that the displaying hue of the three-color light-emitting diode unit 10 is kept "red" throughout this range ②.

The user can not only set and retain the upper limit value $X_{high}$ using the upper limit setting switch 8 of FIG. 1, but also set and retain the lower limit value $X_{low}$ using a not-shown lower limit setting switch.

Within the normally-used sound volume setting level range, the displaying hue turns "purple" once the sound volume setting level is lowered below the practical lower limit value, and the displaying hue turns "red" once the sound volume setting level is raised to reach the practical upper limit value.

Thus, by the displaying hue of the light-emitting diode unit 10 changing between the first hue of "purple" and the second hue of "red", the user can know when the sound volume setting level is within the range not smaller than the (practical) lower limit value $X_{low}$ and not greater than the (practical) upper limit value $X_{high}$. Also, the user can know when the (practical) lower limit value $X_{low}$ of the normally-used sound volume setting levels has been reached, by the displaying hue of the light-emitting diode unit 10 turning to the first hue "purple"; similarly, by the displaying hue turning to the second hue "red", the user can know when the upper limit value $X_{high}$ of the normally-used sound volume setting levels has been reached.

The above-mentioned relationship between the sound volume setting level x and the color table number y can be expressed by the following mathematical expressions. These mathematical expressions may be used when the CPU 4*a* performs predetermined arithmetic operations by executing a particular program.

$$y=0\ (0 \leqq x \leqq X_{low})$$

$$y=\text{floor}\ \{(n-1)/(X_{high}-X_{low})\cdot(x-X_{low})\}+1\ (X_{low} \leqq x \leqq X_{high})$$

$$y=n\ (X_{high} \leqq x \leqq X_{max})$$

In this second example too, where the displaying hue varies stepwise, rather than continuously, the steps from the lower limit value $X_{low}$ up to the upper limit value $X_{high}$ of the input volume setting levels to be used to change the displaying hue may be defined in any suitable manner other than that described above in relation to FIG. 3.

Further, in the illustrated example of FIG. 3, the intermediate sound-volume setting level range ① is divided into n equal segments; the color table number y is set to "1" (y=1) in the first segment and "n−1" in the nth segment, and it changes to "n" (y=n) when the upper limit value $X_{high}$ is reached.

In an alternative, the intermediate sound-volume setting level range ① may be divided into "n+1" segments with the first and thirteenth segments each having one half of the sound volume setting width of any one of the other segments; in this case, the color table number y is set to "0" (y=0) in the first segment and "n" in the (n+1)th segment. In another alternative, the sound-volume setting level range ① may be divided into "n+1" equal segments with the color table number y being set to "0" (y=0) in the first segment and "n" (y=n) in the (n+1)th segment.

Figure 4:
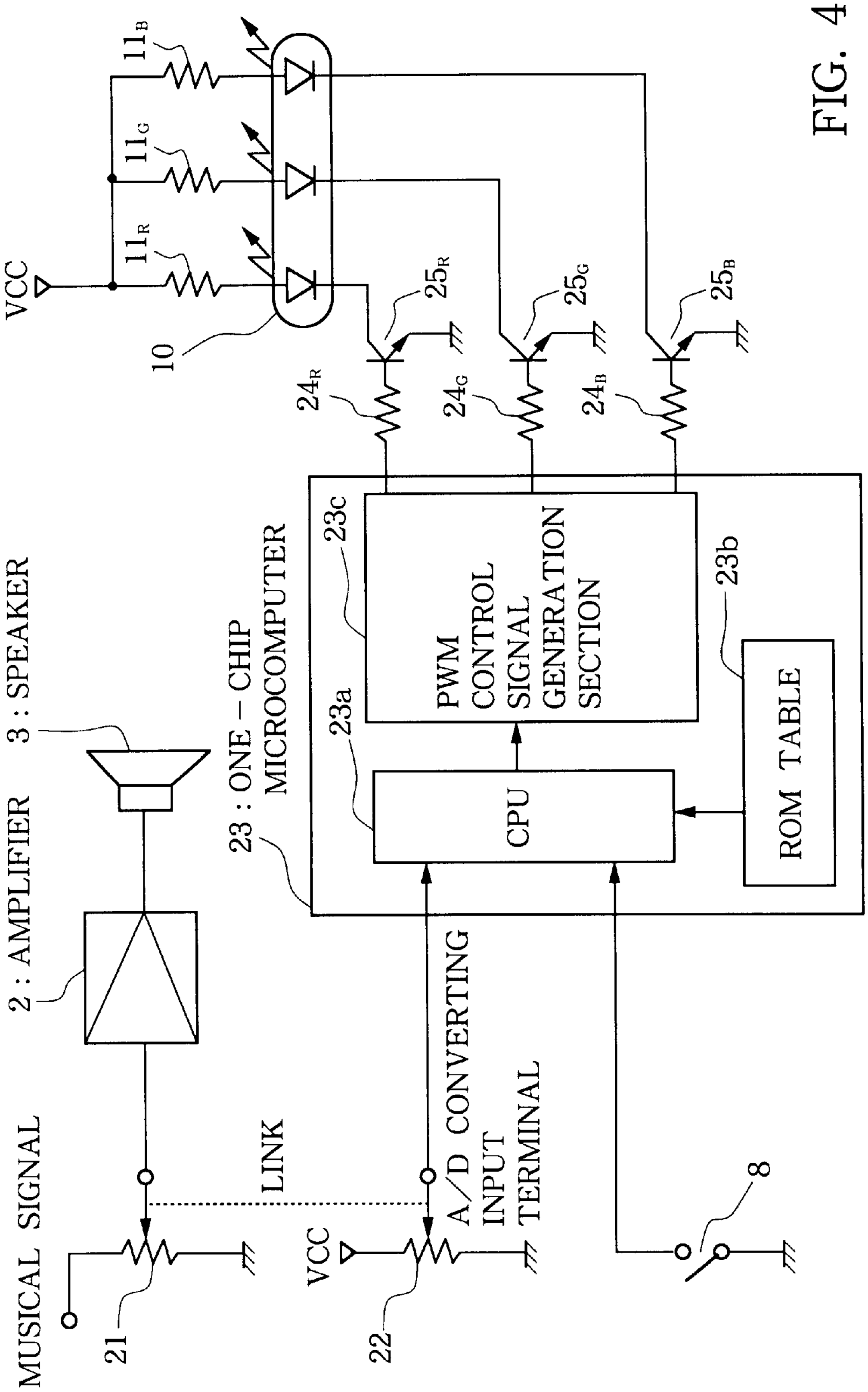
FIG. 4 is a block diagram showing a general setup of the display control apparatus of the present invention which is applied to an audio amplifier employing a mechanical volume control unit.

FIG. 4 is a block diagram showing the display control apparatus of the present invention as applied to an audio amplifier that employs a mechanical volume control unit.

Elements in FIG. 4 similar to those in FIG. 1 are represented by the same reference characters as in FIG. 1 and will not be described here to avoid unnecessary duplication. Reference numeral 21 represents a mechanical volume control unit that is in the form of a variable resistor having a sliding contact. Reference numeral 22 also represents a mechanical volume control unit, and these two mechanical volume control units 21 and 22 together constitute a pair of volume control units rotatable in linked relation to each other. One-chip microcomputer 23 includes a CPU 23*a*, a ROM table 23*b* and a PWM-controlled signal generation section 23*c*.

Namely, the function of the PWM-control-based LED driver circuit 9 shown in FIG. 1 is performed here by the one-chip microcomputer 23 executing a predetermined program. Reference numerals $\mathbf{25}_R$, $\mathbf{25}_G$ and $\mathbf{25}_B$ are driving transistors for supplying drive currents to the corresponding LED chips of the three-color light-emitting diode unit 10. The respective base electrodes of the driving transistors $\mathbf{25}_R$, $\mathbf{25}_G$ and $\mathbf{25}_B$ are supplied, via base-current limiting resistors $\mathbf{24}_R$, $\mathbf{24}_G$ and $\mathbf{24}_B$, with driving currents of controlled output values that are generated by the PWM-controlled signal generation section 23*c*. The LED chips of the three-color light-emitting diode unit 10 are connected to the respective collector electrodes of the driving transistors $\mathbf{25}_R$, $\mathbf{25}_G$ and $\mathbf{25}_B$.

Sound volume setting level set via the mechanical volume control unit 21 can not be output directly (i.e., as it is,) to the one-chip microcomputer 23. For this reason, a power supply voltage VCC is applied to the mechanical volume control unit 22 linked with the volume control unit 21, and a divided voltage corresponding to a rotating angle of the volume control unit 22 is obtained from the sliding contact of the volume control unit 22. The divided voltage has a voltage value corresponding to the current sound volume setting level, and it is given to an A/D-converting input terminal of the one-chip microcomputer 23. Then, the CPU 23*a* performs analog-to-digital conversion of the voltage value and thereby processes the converted voltage value, for example, as a sound volume setting level of a linear scale.

The display control apparatus of FIG. 4 sets an upper limit value of the sound volume setting levels in the same manner as having been described above in relation to FIG. 1; therefore, the manner in which the display control apparatus of FIG. 4 sets the upper limit value will not be described here to avoid unnecessary duplication.

Note that the above-mentioned two mechanical volume control units 21 and 22 present various relationships between the rotating angle and the resistance value based on their resistance value curves. Thus, if it is desired to change the displaying hue in response to the rotating angle while using the mechanical volume control units 21 and 22 having resistance value curves of "A" curve characteristics, there arises a need to change the output values of the red, green and blue hues corresponding to the various color table numbers y which are stored in the ROM table 4*b*.

In anther alternative, the mechanical volume control unit 21 may be constructed to operate with "A" curve characteristics while the other mechanical volume control unit 22 may be constructed to operate with "B" curve (linear) characteristics. This alternative arrangement can provide a divided voltage corresponding to a rotating angle, so that it is possible to obtain a color table number y corresponding to a rotating angle without changing the contents of the ROM table 4*b*.

Further, whereas the embodiments of the invention have been described above as employing the one-chip microcomputer 4 or 23, a general-purpose CPU may be employed in place of such a one-chip microcomputer. In this case, the CPU, ROM and RAM are connected to a bus, and the CPU executes necessary programs stored in the ROM, using the RAM as its working area. Although the table storing the respective output values of the red, green and blue hues in corresponding relation to various color table numbers y may be contained in a rewritable ROM, it is more preferable that such a table be provided in a flash memory, because, in this case, the color table can be rewritten as desired.

With reference to FIGS. 5 to 7, the following paragraphs describe specific examples in which the hue-display-related components, i.e. the volume setting knob 5*a* and three-color light-emitting diode unit 10, are arranged on a front panel of the audio amplifier. Although these examples will be described as using an electronic volume control unit, a mechanical volume control unit may be used in stead of such an electronic volume control unit.

Figure 5A:
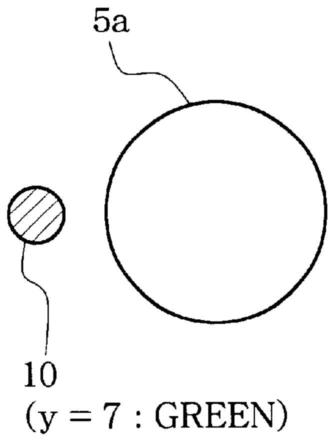
FIGS. 5A and 5B are views showing a first example of arrangement of hue-display-related components on a front panel of the audio amplifier and a modification of the first example.
Figure 5B:
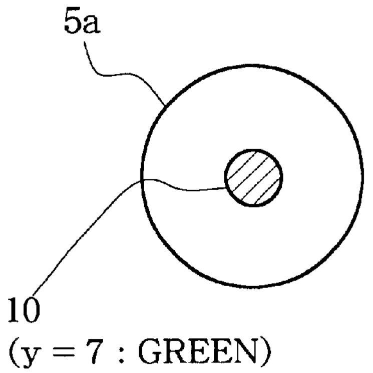

FIGS. 5A and 5B show a first example of the arrangement of the hue-display-related components on the front panel of the audio amplifier, and a modification of the first example. The package enclosing the three-color light-emitting diode unit 10 may be in any desired one of various shapes. In many cases, the package may be provided with an ornamental cover and lens, although not specifically shown here. The package enclosing the three-color light-emitting diode unit 10 is shown in FIGS. 5A and 5B as having a circular shape, for convenience of illustration.

More specifically, the three-color light-emitting diode unit 10 in the illustrated example of FIG. 5A is provided adjacent to the volume setting knob 5*a*, and the light-emitting diode unit 10 in the illustrated example of FIG. 5B is embedded centrally in the volume setting knob 5*a* so that it can be illuminated at the center of the setting knob 5*a*. In each of the illustrated examples of FIGS. 5A and 5B, as the volume setting knob 5*a* is turned within the sound-volume setting level range for changing the displaying hue, the displaying hue of the light-emitting diode unit 10 changes between "purple" and "red". When the input sound volume setting level is below or above the hue-changing input sound-volume setting level range, the displaying hue is kept "purple" or "red" even if it is within the range of sound-volume setting levels that can be input via the volume control unit.

Figure 6A:
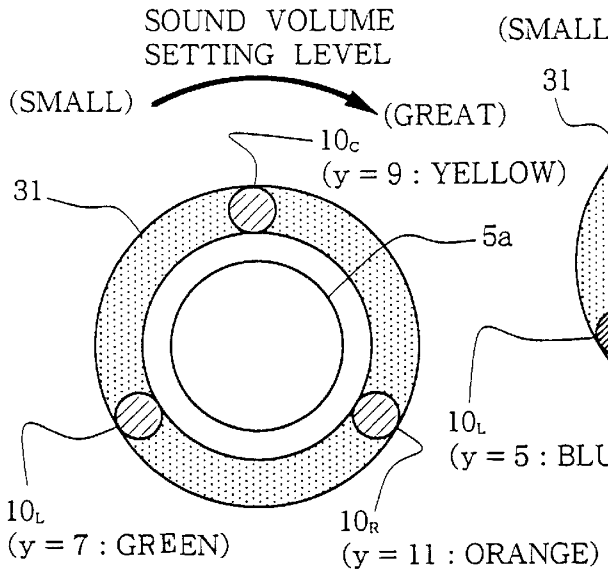
FIGS. 6A to 6D are views showing a second example of the arrangement of the hue-display-related components on the front panel of the audio amplifier, a modification of the second example, and examples of assignment of color table numbers to three three-color light-emitting diode units.
Figure 6B:
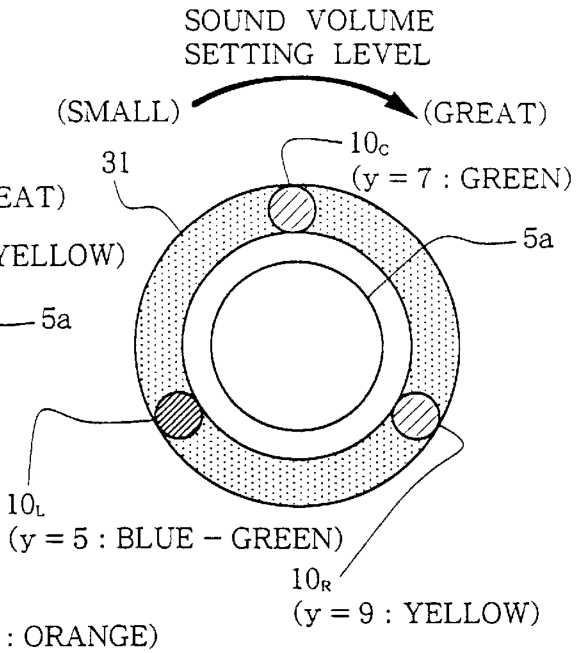
Figure 6C:
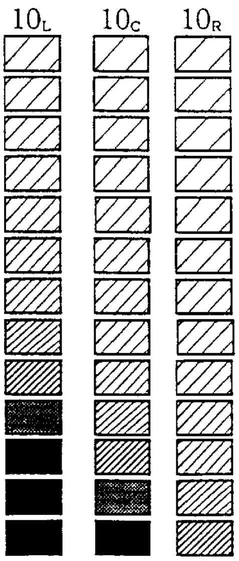
Figure 6D:
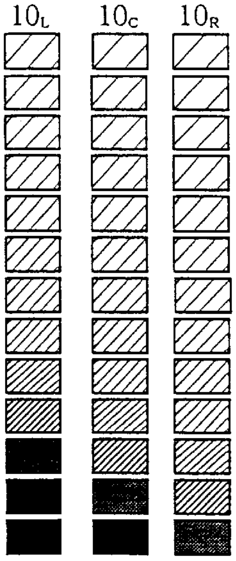

FIGS. 6A and 6B show a second example of the arrangement of the hue-display-related components where a plurality of three-color light-emitting diode units and volume setting knob 5*a* are provided on the front panel of the audio amplifier, and a modification of the second example. FIGS. 6C and 6D show examples of assignment of color table numbers to three three-color light-emitting diode units. The second example is intended to also indicate correspondency between a rotating direction of the volume setting knob 5*a* and a varying (increasing or decreasing) direction of the sound volume setting level. In FIG. 6A, the three three-color light-emitting diode units are provided in spaced-apart relation from one another around the outer periphery of the volume setting knob 5*a* Specifically, reference character $\mathbf{10}_L$ represents a first three-color light-emitting diode unit positioned close to a lower left portion of the volume setting knob 5*a*, $\mathbf{10}_C$ represents a second three-color light-emitting diode unit positioned close to an upper middle portion of the volume setting knob 5*a*, and $\mathbf{10}_R$ represents a third three-color light-emitting diode unit positioned close to a lower right portion of the volume setting knob 5*a*.

Further, the three three-color light-emitting diode units $\mathbf{10}_L$, $\mathbf{10}_C$ and $\mathbf{10}_R$ are together covered with an annular indicator cover 31 that has a semitransparent milky-while color. The indicator cover 31 serves to scatter light passed therethrough and thereby mix respective colors emitted from the adjoining diode units $\mathbf{10}_L$, $\mathbf{10}_C$ and $\mathbf{10}_R$.

Current sound volume setting level is indicated by the displaying hue of the upper-middle three-color light-emitting diode unit $\mathbf{10}_C$. Further, the displaying hues of the lower-left three-color light-emitting diode unit $\mathbf{10}_L$ and lower-right three-color light-emitting diode unit $\mathbf{10}_R$ are differentiated from each other in correspondence with the volume control unit rotating direction for increasing the sound-volume setting level. Also, the three-color light-emitting diode units $\mathbf{10}_L$, $\mathbf{10}_C$ and $\mathbf{10}_R$ together can roughly indicate the current sound volume setting level.

More specifically, in the illustrated example of FIG. 6A, the upper-middle three-color light-emitting diode unit $\mathbf{10}_C$ is set to the color table number y of "9" representing the "yellow" hue, in accordance with the current sound volume setting level. Because the rotating direction to increase the current sound volume setting level is clockwise, the lower-left three-color light-emitting diode unit $\mathbf{10}_L$ in the illustrated example is set to the color table number y of "7" representing the "green" hue while the lower-right three-color light-emitting diode unit $\mathbf{10}_R$ is set to the color table number y of "11" representing the "orange" hue.

In the illustrated example of FIG. 6B, the upper-middle three-color light-emitting diode unit $\mathbf{10}_C$ is set to the color table number y of "7" representing the "green" hue, in accordance with the current sound volume setting level. The lower-left three-color light-emitting diode unit $\mathbf{10}_L$ is set to the color table number y of "5" representing the "greenish blue" hue while the lower-right three-color light-emitting diode unit $\mathbf{10}_R$ is set to the color table number y of "9" representing the "yellow" hue.

Note that the above-mentioned annular indicator cover 31 is not necessarily essential and may be omitted. However, because the emitted colors of the adjoining three-color light-emitting diode units mix with each other in intermediate portions between the adjoining diode units, the provision of such an annular indicator cover 31 is preferable in that the entire indicator cover 31 can present hues progressively changing in the setting-level-increasing rotating direction.

FIG. 6C shows a first example of assignment, to the three-color light-emitting diode units $\mathbf{10}_L$, $\mathbf{10}_C$ and $\mathbf{10}_R$, of the color table numbers. In this figure, reference characters $y_L$, $y_C$ and $y_R$ represent color table numbers to be set to the three-color light-emitting diode units $\mathbf{10}_L$, $\mathbf{10}_C$ and $\mathbf{10}_R$, respectively. Relationship between the sound volume setting level x and the color table number $y_C$ is similar to that between the sound volume setting level x and the color table number y having been set forth above in relation to FIGS. 2 and 3, and hence illustration of the relationship is omitted here. Generally, in the illustrated example of FIG. 6C, the color table numbers to be set to the three-color light-emitting diode units $\mathbf{10}_L$, $\mathbf{10}_C$ and $\mathbf{10}_R$ are differentiated from one another by "2" in a similar manner to the illustrated example of FIG. 6B.

FIG. 6D shows a second example of the assignment, to the three-color light-emitting diode units $\mathbf{10}_L$, $\mathbf{10}_C$ and $\mathbf{10}_R$, of the color table numbers. Generally, in the illustrated example of FIG. 6D, the color table numbers to be set to the three-color light-emitting diode units $\mathbf{10}_L$, $\mathbf{10}_C$ and $\mathbf{10}_R$ are differentiated from one another by "1".

Note that, in each of the illustrated examples of FIGS. 6C and 6D, the color table numbers $y_L$, $y_C$ and $y_R$ can not be sometimes differentiated from one another as above when the upper-middle three-color light-emitting diode unit $\mathbf{10}_C$ is set to the color table number y of "0" representing the "purple" hue or the color table number y of "12" representing the "red" hue. However, because all the three-color light-emitting diode units $\mathbf{10}_L$, $\mathbf{10}_C$ and $\mathbf{10}_R$ are not illuminated in "purple" or "red", it is possible to visually discern between the increasing and decreasing directions of the sound volume setting level. In the illustrated example of FIG. 6C, the difference among the color table numbers is "1" or "2" when the upper-middle three-color light-emitting diode unit $\mathbf{10}_C$ is set to the color table number $y_C$ of "11" or "1".

In the annular indicator cover 31 of FIGS. 6A and 6B, a lower portion of the cover 31 between the lower-left three-color light-emitting diode unit $\mathbf{10}_L$ and the lower-right three-color light-emitting diode unit $\mathbf{10}_R$ exhibits a neutral color, which may prevent the user from readily discerning between the increasing and decreasing directions of the sound volume setting level and may also present a more or less odd appearance.

Figure 7A:
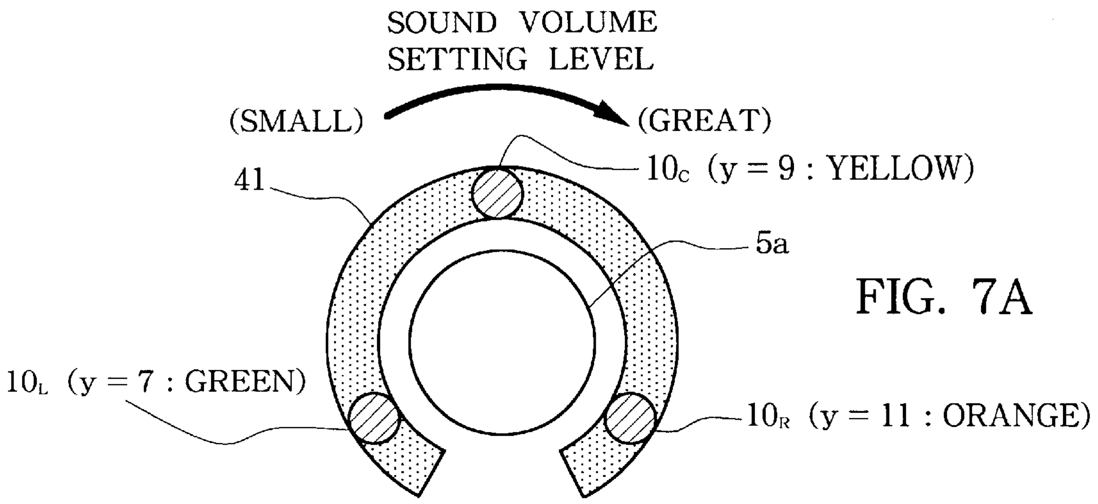
FIGS. 7A to 7C are views showing third, fourth and fifth examples of the arrangement of the hue-display-related components on the front panel of the audio amplifier.
Figure 7B:
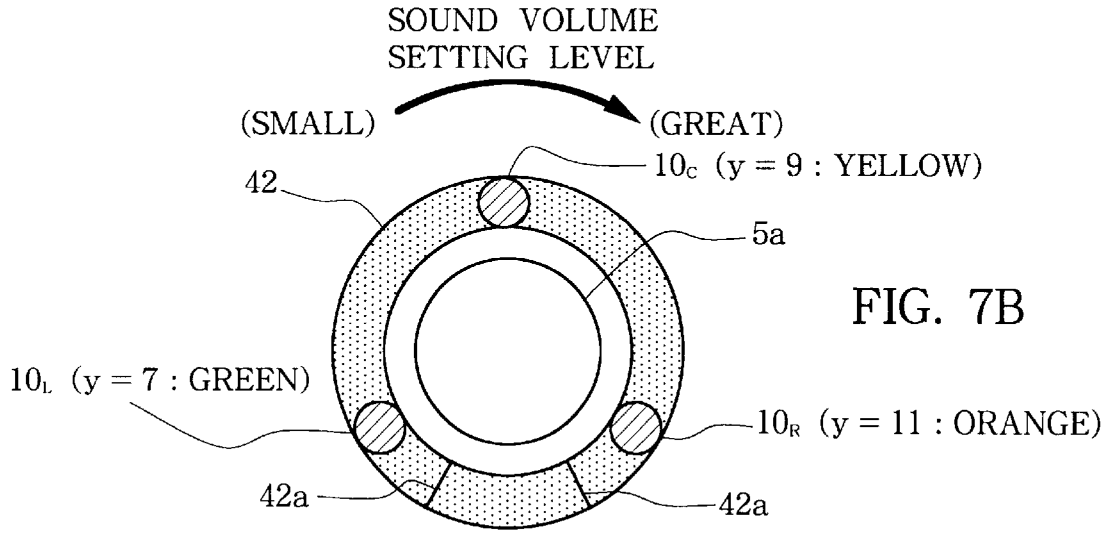
Figure 7C:
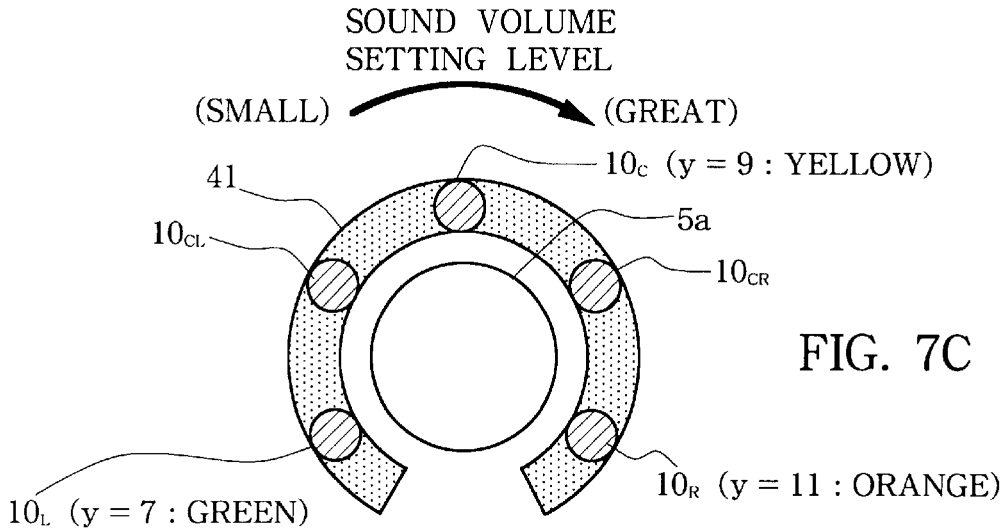

FIGS. 7A to 7B show third and fourth examples of the arrangement of the hue-display-related components on the front panel of the audio amplifier where three three-color light-emitting diode units are employed, and FIG. 7C shows a fifth example of the arrangement of the hue-display-related components on the front panel of the audio amplifier where five three-color light-emitting diode units are employed.

In the illustrated example of FIG. 7A, the three three-color light-emitting diode units are together covered with an indicator cover 41 shaped like a "Landholt ring" of an eyesight test chart, i.e. a ring having its lower arcuate portion cut away.

In the illustrated example of FIG. 7B, the three three-color light-emitting diode units are together covered with an indicator cover 42 that includes light-blocking partitions 42*a* and 42*b* provided in its lower left and right positions. These light-blocking partitions 42*a* and 42*b* function to prevent light radiation from a lower portion of the indicator cover 42.

The illustrated example of FIG. 7C is different from the illustrated example of FIG. 7A in that five, rather than three, three-color light-emitting diode units are employed to enhance the expression of neutral colors. Here, $\mathbf{10}_{CL}$ represents an upper-left three-color light-emitting diode unit that emits a "yellowish green" hue corresponding to the color table number y of "8", and $\mathbf{10}_{CR}$ represents an upper-right three-color light-emitting diode unit that emits a "yellowish orange" hue corresponding to the color table number y of "10".

Alternatively, five, rather than three, three-color light-emitting diode units may be employed in the illustrated example of FIG. 6 or FIG. 7B.

Figure 8A:
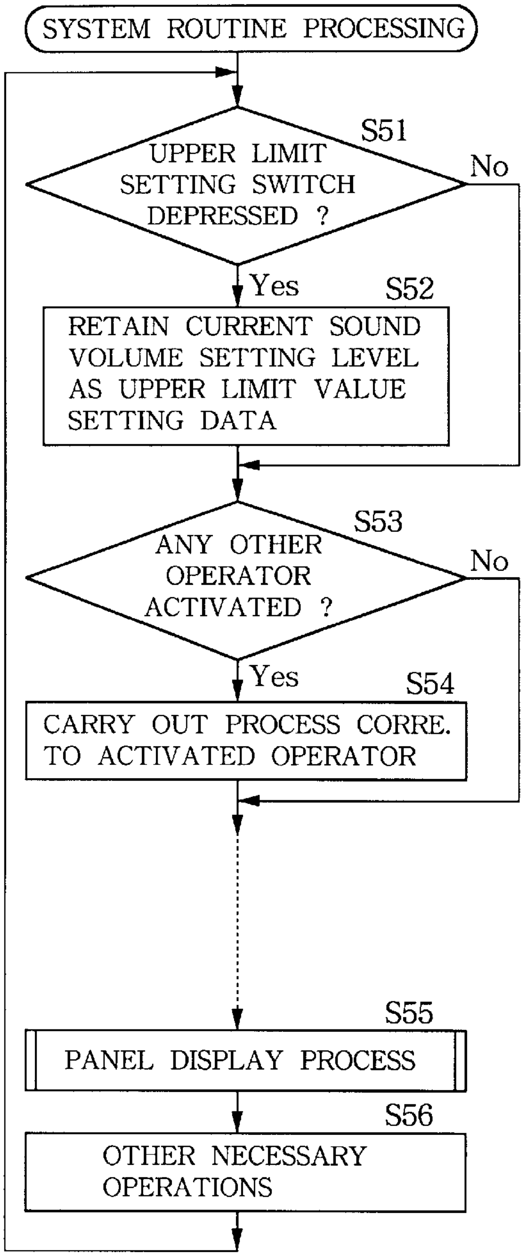
FIG. 8A is a flow chart showing an example of processing for displaying a sound volume setting level in a predetermined one of various color hues.

Finally, a description will be made about processing carried put in the display control device of the invention for displaying a sound volume setting level in a predetermined hue via the microcomputer. FIG. 8A is a flow chart showing an example of the processing for displaying a sound volume setting level in a predetermined hue.

The flow chart of the processing for displaying a sound volume setting level in a predetermined hue is incorporated in a processing loop of the entire system. However, this processing for displaying a sound volume setting level in a predetermined hue may be executed as interrupt processing or independently as multi-task processing.

At step S51, a determination is made as to whether or not the upper limit setting switch has been activated. If answered in the affirmative, the microcomputer proceeds to step S52, but if answered in the negative, the microcomputer jumps to step S53. The current sound volume setting level is stored as upper limit value setting data at step S52, and then the microcomputer jumps to step S53.

At step S53, it is determined whether or not any other operator has been activated. With an affirmative determination, the microcomputer proceeds to step S54, but with a negative determination, the microcomputer jumps to step S55.

At step S54, a process corresponding to the activated other operator is carried out, after which the microcomputer proceeds to step S55. At step S54, the microcomputer performs various operations, such as detection of a rotating direction and angle of the rotary encoder, and detection of activation of the upper limit setting switch 8.

In the case where a sound volume setting level is input through manipulation of a remote controller, the microcomputer detects depression of the up or down button and depression of the upper limit setting button. Although not specifically described here, the display control apparatus includes other operators, such as a ten-button keypad. The microcomputer performs a panel display process at step S55 as will be detailed below, and performs other necessary operations at step S56.

Figure 8B:
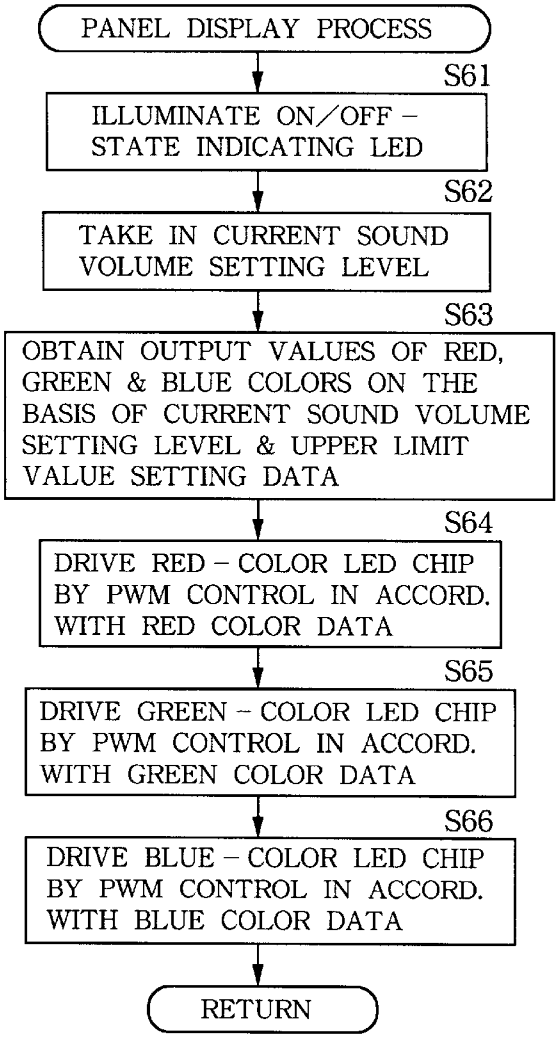
FIG. 8B is a flow chart showing details of a panel display process carried out at step S55 of the processing of FIG. 8A.

FIG. 8B is a flow chart showing details of the panel display process at step S55. At step S61, the microcomputer turns on or illuminates an ON/OFF-state indicating light-emitting diode to indicate that the power is ON. At step S62, the microcomputer takes in the current sound volume setting level. At step S63, a color table number y is calculated on the basis of the current sound volume setting level and upper limit value setting data, and then data indicative of the respective output values of the red (R), green (G) and blue (B) colors are obtained with reference to the ROM table 4*b* or 23*b* in accordance with the thus-calculated color table number y.

Then, the "red color" LED chip is driven at step S64 by "red color" PWM control in accordance with the red (R) color data, the "green color" LED chip is driven at step S65 by "green color" PWM control in accordance with the green (G) color data, and the "blue color" LED chip is driven at step S66 by "blue color" PWM control in accordance with the blue (B) color data. After that, the microcomputer reverts to step 56 of the sound volume setting level display processing of FIG. 8A.

The above-described processing is started up upon turning-on of the power and carried out repetitively until the power is turned off.

Alternatively, once the user turns on the power for the first time after purchase of the audio amplifier, a particular registration process may be initiated to allow the user to perform operation for setting the upper limit value and various necessary ranges. Namely, when the user wants to change factory-set upper limit value data on a display screen, the user turns the volume setting knob to change a factory-set upper limit value of input sound volume setting levels and then turns on the upper limit setting switch 8 to retains the thus-changed upper limit value.

Further, there may be provided in advance a plurality of factory-set settings corresponding to feelings of potential users so that each of the users can select any desired one of the factory-set settings. Such selection of the factory-set setting may be made during the system routine processing of FIG. 8A.

The present invention has been described above as applied to visually display a sound volume setting level for an audio amplifier that receives musical signals or the like. Alternatively, the present invention may be employed to display gain setting values of sound amplifier circuits, such as those of AV (AudioVisual) amplifiers, radio receivers, television receivers and the like, without being restricted to pre-amplifiers, pre-main-amplifiers and mini-component amplifiers.

Furthermore, the present invention may also be used to display gain setting values in cases where desired input signals are to be amplified. The terms "attenuation" used in the context of the present invention embrace even attenuation of any desired input signals, as seen from the above-described examples where the attenuation is expressed as negative gain in decibel representation.

Furthermore, whereas the present invention has been described above as employing a three-color light-emitting diode unit as the hue-variable display device, it may use light-emitting diodes of two colors, "green" and "red", to display a gain setting value in any one of hues varying among "red", "orange" and "green".

Furthermore, whereas the present invention has been described above as employing a plurality of LED chips of different emitting colors enclosed together in a single package, the LED chips of different emitting colors may be enclosed in separate packages, and emitted lights from the individual packages may be mixed to provide an overall displaying hue variable in response to a current gain setting value.

In addition, the basic principles of the present invention are also applicable to colored display devices, such as colored fluorescent display tubes, colored liquid crystal display devices and CRTs (Cathode Ray Tubes), to visually display a current sound setting level in a predetermined hue.

As apparent from the foregoing, the present invention allows the user to readily recognize, at a glance, variations of a gain setting value, such as a sound volume setting level, by just viewing the displaying hue of the hue-variable display device.

Further, the user can set a desired range of input gain setting values that are to be used to change the displaying hue of the hue-variable display device. As a consequence, the user can also know, from the hue exhibited by the hue-variable display device, that the current gain setting value is within the normal range.

Furthermore, because the hue-variable display device may have only a small hue displaying area, the necessary display space for implementing the present invention can be relatively small.

Furthermore, where the displaying hue of the hue-variable display device is varied from "purple" or "blue" to "red" in accordance with magnitude or intensity of the gain setting value as proposed by the described embodiments, the present invention can provide displaying hue variations matching with human feelings about safety and danger, and thus the user can intuitively recognize the current gain setting value. In particular, if the displaying hue is varied from "purple" to "red", it is possible to make the best of the hue displaying capability of the hue-variable display device.

Even in the case where the current gain setting value is numerically displayed via another type of hue-variable display device, such as a colored fluorescent display tube or colored liquid crystal display device, combined use of such a hue-variable display device and the display control device of the present invention allows the user to accurately identify the current gain setting value even at a distance.

What is claimed is:

1. A display control apparatus for displaying a gain setting value in a color hue, said display control apparatus comprising:

an input-upper-limit setting section that sets a predetermined upper limit value of gain setting values to be input to said display control apparatus; and a displaying-hue control section that receives a gain setting value from a variable gain control device, wherein when the received gain setting value is not greater than the predetermined upper limit value, said displaying-hue control section outputs a hue control signal to vary a displaying hue of a hue-variable display device between a predetermined first hue and a predetermined second hue in accordance with intensity of the received gain setting value, but when the received gain setting value is greater than the predetermined upper limit value, said displaying-hue control section outputs a hue control signal to set the displaying hue of the hue-variable display device to the predetermined second hue.

2. A display control apparatus for displaying a gain setting value in a color hue, said display control apparatus comprising:

an input-range setting section that sets a predetermined lower limit value and predetermined upper limit value of gain setting values to be input to said display control apparatus; and a displaying-hue control section that receives a gain setting value from a variable gain control device, wherein when the received gain setting value is equivalent to or greater than the predetermined lower limit value but equivalent to or smaller than the predetermined upper limit value, said displaying-hue control section outputs a hue control signal to vary a displaying hue of a hue-variable display device between a predetermined first hue and a predetermined second hue in accordance with intensity of the received gain setting value, when the received gain setting value is smaller than the predetermined lower limit value, said displaying-hue control section outputs a hue control signal to set the displaying hue of the hue-variable display device to the predetermined first hue, and when the received gain setting value is greater than the predetermined upper limit value, said displaying-hue control section outputs a hue control signal to set the displaying hue of the hue-variable display device to the predetermined second hue.

3. A display control apparatus as claimed in claim 1 wherein said predetermined first hue is purple or blue and said predetermined second hue is red.

4. A display control system comprising:

a volume control unit having a predetermined gain range from a first gain level to a second gain level;

a setting device that sets a certain range within the predetermined gain range of said volume control unit;

a controller that sets a range of hues from a first hue to a second hue corresponding to the certain range set via said setting device; and a display device that variably displays a volume setting value of said volume control unit according to a variable range, wherein the variable range corresponds to the range of hues set by said controller.

5. A display control system as claimed in claim 4 wherein the certain range is smaller than the predetermined gain range of said volume control unit.

6. A display control system as claimed in claim 4 wherein said first hue is red and said second hue is purple.

7. A display control system as claimed in claim 4 wherein said controller includes a table for setting the range of hues.

8. A display control system as claimed in claim 7 wherein said table is used to set an upper limit of the range of hues.

9. A display control system comprising:

a volume control unit having a predetermined gain range from a first gain level to a second gain level;

a setting device that sets a certain range within the predetermined gain range of said volume control unit;

a controller that sets a range of hues from a first hue to a second hue corresponding to the certain range set via said setting device, wherein the controller includes a table for setting the range of hues and wherein the upper limit of the range of hues corresponds to an upper limit of volume setting values set via said setting; and a display device that variably displays a volume setting value of said volume control unit according to a variable range, wherein the variable range corresponds to the range of hues set by said controller.

10. A display control system as claimed in claim 7 wherein when a current volume level set via said volume control unit exceeds the upper limit of volume, the hue is kept unchanged.

11. A display control system as claimed in claim 7 wherein said table is used to set a lower limit of the range of hues.

12. A display control system comprising:

a volume control unit having a predetermined gain range from a first gain level to a second gain level;

a setting device that sets a certain range within the predetermined gain range of said volume control unit;

a controller that sets a range of hues from a first hue to a second hue corresponding to the certain range set via said setting device wherein the controller includes a table for setting the range of hues and wherein the lower limit of the range of hues corresponds to a lower limit of volume setting values set via said setting device; and a display device that variably displays a volume setting value of said volume control unit according to a variable range, wherein the variable range corresponds to the range of hues set by said controller.

13. A display control system as claimed in claim 4, wherein said display device comprises three LEDs capable of emitting red-color, green-color, and blue-color light, respectively.

14. A display control system as claimed in claim 13 wherein said three LEDs are provided around an outer periphery of a volume setting knob coupled to volume control unit.

15. A display control system as claimed in claim 14 wherein each of said three LEDs indicates the volume setting value and displays a hue within the variable range corresponding to the volume setting value of said volume control unit.

* * * * *